(12) United States Patent
Yoon et al.

(10) Patent No.: US 6,657,908 B2
(45) Date of Patent: Dec. 2, 2003

(54) DDR SDRAM FOR STABLE READ OPERATION

(75) Inventors: Young-Jin Yoon, Ichon-shi (KR); Kwan-Weon Kim, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 10/283,535

(22) Filed: Oct. 29, 2002

(65) Prior Publication Data

US 2003/0053340 A1 Mar. 20, 2003

Related U.S. Application Data

(62) Division of application No. 09/742,815, filed on Dec. 19, 2000, now Pat. No. 6,504,774.

(30) Foreign Application Priority Data

Dec. 28, 1999 (KR) ........................................ 1999-63921

(51) Int. Cl.[7] ............................................. G11C 13/00
(52) U.S. Cl. .................................. 365/203; 365/189.05
(58) Field of Search .............................. 365/203, 233, 365/189.05, 230.02, 230.03, 194

(56) References Cited

U.S. PATENT DOCUMENTS

| 5,119,340 A | * | 6/1992 | Slemmer | ............... 365/230.03 |
| 6,205,069 B1 | * | 3/2001 | Kim | ........................... 365/203 |
| 6,215,721 B1 | * | 4/2001 | Kim | ...................... 365/230.03 |

* cited by examiner

Primary Examiner—Vu A. Le
(74) Attorney, Agent, or Firm—Townsend and Townsend and Crew LLP

(57) ABSTRACT

A synchronous memory device which comprises global I/O lines for data input and output from and to a memory core and a pipeline latch circuit for latching data from the global I/O lines. The synchronous memory device includes a circuit that precharges the global I/O lines when a read command signal interrupts a write operation signal, and disables the pipeline latch circuit in order to prevent write data on the global I/O lines from being latched in the pipeline latch circuit. Accordingly, the write data is prevented from being transferred to the pipeline latch circuit at an early stage of the read operation.

3 Claims, 7 Drawing Sheets

DDR SDRAM FOR STABLE READ OPERATION

CROSS-REFERENCES TO RELATED APPLICATIONS

This application is a divisional of application Ser. No. 09/742,815, filed Dec. 19, 2000 now U.S. Pat. No. 6,504,774, which disclosure is incorporated herein by reference for all purposes.

BACKGROUND OF THE INVENTION

1. Field of the Invention

The present invention relates to a semiconductor memory device; and, more particularly, to a device for pre-charging write data during read cycle.

2. Prior Art of the Invention

Generally, because data pad for input and output is shared in a semiconductor memory device, a global input/output line is shared for transferring data in a cell to the data pad during read operation and transferring data in the data input pad to the cell during a write operation. Therefore, when a read operation is to performed after the write operation, the global input/output line should be precharged after the write operation before the read operation.

FIG. 1 is a circuit diagram of a conventional global input/output line precharge device.

Referring to FIG. 1, the conventional global input/output line precharge device includes a latch 100 for cross-coupling a global input/output line GIO and a complementary global input/output line GIOZ, a global input/output delay 110 for feed-backing the delayed version of the global input/output line and the complementary global input/output line GIOZ, a first to a fourth inverters 120, 130, 140 and 150 for inverting feed-backed signals from the global input/output delay 110, a first precharge circuit 160 for applying a power voltage to the global input/output line GIO when high data is feed-backed on the output of the first inverter and short-circuiting the global input/output line GIO to a ground voltage when low data is feed-backed on the output of the second inverter, and a second precharge stage 170 for applying power voltage to the complementary global input/output line GIOZ when high data is feed-backed on the output of the third inverter and short-circuiting the complementary global input/output line GIOZ to ground voltage when low data is feed-backed on the output of the fourth inverter.

FIG. 2 is a circuit diagram of a conventional write enable signal generating circuit. The write enable signal generating circuit acts to make a write data be loaded when a write command is applied and a read data be loaded when a read command is applied.

Referring to FIG. 2, the write enable signal generating circuit has an inverter 200 for inverting the read command, a pulse generator 210 for generating a pulse when write command transits to high, a latch 220 for latch the output of the pulse generator 210, and an inverter for generating the write enable signal EN_DINGIO by inverting the output of the latch 220.

The write enable signal EN_DINGIO transits to logic low when the read command is valid and the write enable signal EN_DINGIO transits to logic high when the write command is applied.

FIG. 3 is a circuit diagram of a conventional write driver. The write diver is a circuit for transferring write data to the global input/output line by making the global input/output line precharged to high after a write operation.

Referring to FIG. 3, the write driver includes serially coupled inverters 300 for delaying the write enable signal EN_DINGIO by a predetermined time delay, a first NAND gate 310 for NAND-operating the output of the serially coupled inverters 300 with write data DIN, a second NAND gate 320 for NAND-operating the output of the serially coupled inverters 300 with complementary write data DINZ, a first NMOS transistor 350 having a gate coupled to the output of the first inverter 330 and source-drain circuit between the complementary global input/output line GIOZ and the ground voltage, and a second NMOS transistor 360 having a gate coupled to the output of the second inverter 330 and source-drain circuit between the global input/output line GIO and the ground voltage.

When the write enable signal EN_DINGIO generates a pulse of logic high, the write data DIN and complementary write data DINZ are applied to the first and the second NAND gates. If the write data DIN is on logic high, the first NMOS transistor 350 is turned on so that complementary global input/output line GIOZ is discharged to the ground voltage while the second NMOS transistor is remained as turned off to keeping the global input/output line GIO precharged to logic high because the complementary write data DINZ is on logic low. And also, when the read command is valid, the write enable signal EN_DINGIO transits to logic low so that the first and second NMOS transistors are turned off and the write data is not transferred to the global input/output line.

FIG. 4 is a circuit diagram of a conventional reset pipeline latch. This circuit activates a pipe signal (PCD) notifying the pipeline latch circuit that load the data is loaded on the global input/output line GIO in order to data loaded on the global input/output line GIO during the read operation to the pipeline latch for burst length operation.

Referring to FIG. 4, the conventional reset pipeline latch includes a PMOS transistor 400 having a gate to which a reset signal TP_RST activated to logic high when read operation is performed is applied and a source-drain formed between the power voltage and a node N, an NMOS transistor 410 coupled between the node N and the ground voltage and having a gate coupled to an output enable signal OE0 delayed by a predetermined time delay, the output enable signal OE0 determining data output period using the reset signal, read command and CAS latency, a PMOS transistor 420 having a gate to which a power-up signal PWRUP and source-drain formed between the power voltage and the node, a latch 430 for latching the node, and serially coupled inverters 440 for delaying the output of the latch 430 and outputting a reset pipeline latch signal RST_PLATCHZ.

The reset pipeline latch signal RST_PLATCHZ activates the pipe signal (PCD) when it is on logic high and inactivates the pipe signal (PCD) when it is on logic low.

FIG. 5 is a timing diagram for explaining a conventional problem.

Referring to FIG. 5, because upper data synchronized with data strobe signal is applied from $0.75 \mathrm{xt}_{CK}$ (a cycle of clock) to $1.25 \mathrm{xt}_{CK}$ and lower data is applied $0.5 \mathrm{xt}_{CK}$ after the upper data is applied, time when the write enable signal EN_DINGIO prevents the write data from being transferred to the global input/output line after the read command is activated is retarded. Therefore, even when the read operation is activated, the non-reset write data is loaded on the global input/output line and the reset pipeline latch signal RST_PLATCHZ that resets the pipeline latch circuit for transferring the read data rises at a time that the write data is activated so that the pipe signal (PCD) notifying the pipeline latch circuit that the read data is on the global input/output line during read operation is enabled and the write data is misapplied to the pipeline latch circuit.

Accordingly, if the write data is not reset by a time when the reset pipeline latch signal RST_PLATCHZ becomes logic high, failure of the pipe signal (PCD) occurs due to the write data.

SUMMARY OF THE INVENTION

Therefore, it is an object of the present invention to provide a DDR SDRAM capable of normal read operation by pre-charging write data on a global input/output line and preventing a pipeline for storing read data from activated by the write data.

In accordance with an aspect of the present invention, there is provided a semiconductor memory device comprising: a latch for latching data on a global input/output line and a complementary global input/output line; a global input/output line delay for delaying the data on the global input/output line and the counter-global input/output line by a predetermined time delay; a global input/output line pre-charge logic for pre-charging the global input/output line in response to a feedback signal from the global input/output line delay; a first precharge logic for applying a power voltage to the global input/output line when a first logic state is feed-backed on the output of the global input/output line precharge logic and applying a ground voltage to the global input/output line when a second logic state is feed-backed on the output of the global input/output line precharge logic; and a second precharge logic for applying the power voltage to the counter-global input/output line when the first logic state is feed-backed on the output of the global input/output line precharge logic and applying the ground voltage to the complementary global input/output line when the second logic state is feed-backed on the output of the global input/output line precharge logic.

The semiconductor memory device of the present invention further comprises: a PMOS transistor having a gate to which a reset signal is activated to logic high when read operation is performed is applied and a source-drain formed between power voltage and node; an NMOS transistor serially coupled between the node N and a ground voltage and having gate to which the reset signal and an output enable signal, that is activated during the read operation, delayed by a predetermined time delay are applied; a PMOS transistor having a gate to which a power-up signal is applied and a source-drain formed between the power voltage and the node; a latch for latching the node; a global input/output line precharge logic for receiving the output of the latch and for preventing data from loading from a pipeline if a write enable signal is logic high; and serially, coupled inverters for delaying the output of the global input/output line precharge logic to output a reset pipeline latch signal.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to the accompanying drawings.

Figure 1:
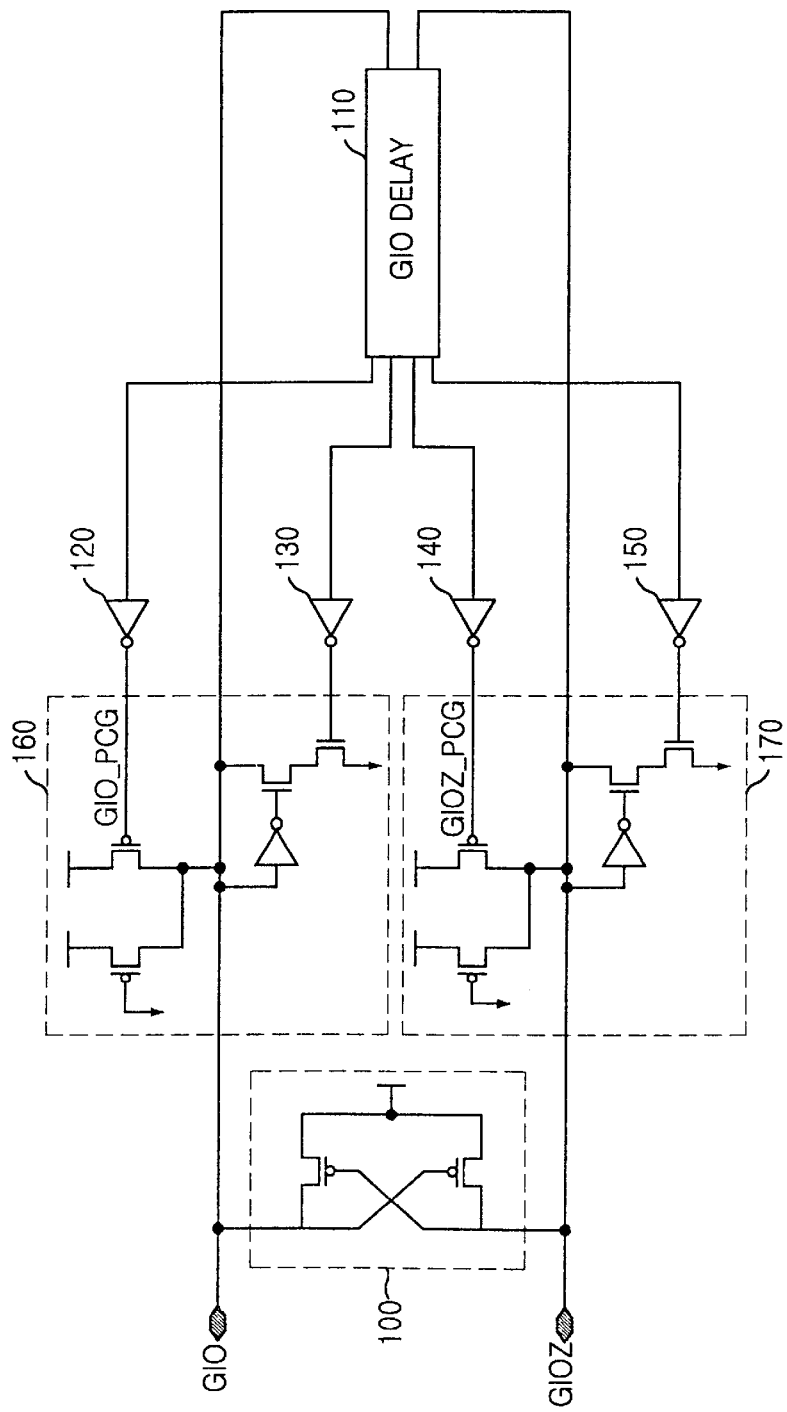
FIG. 1 is a circuit diagram of a conventional global input/output precharge device.
Figure 2:
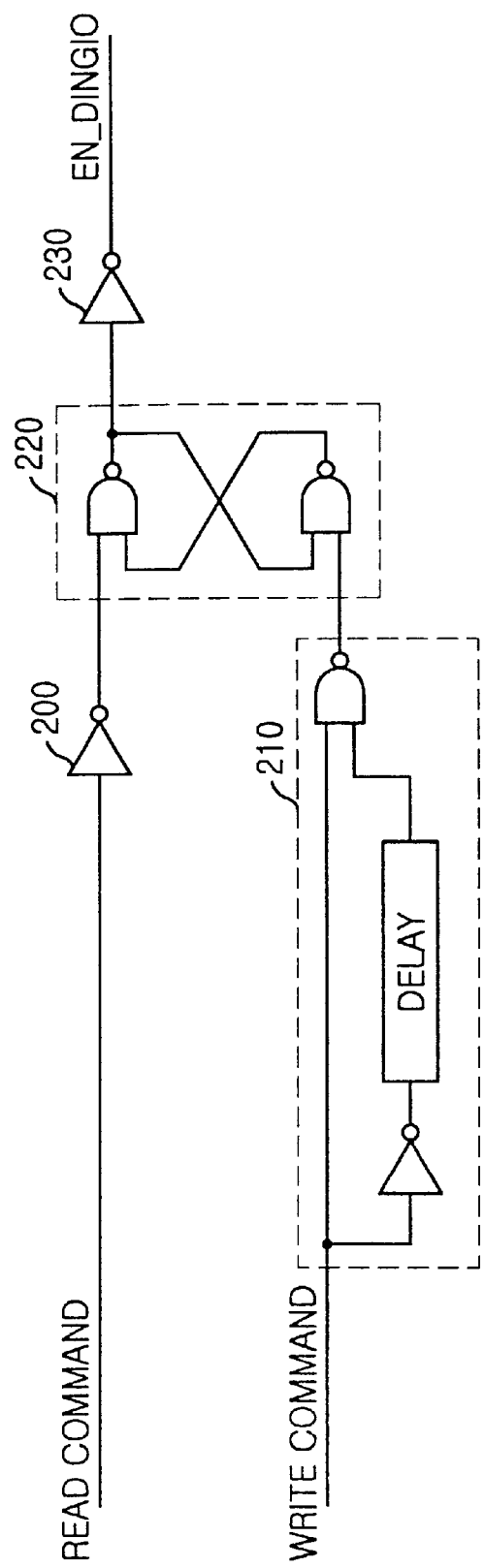
FIG. 2 is a circuit diagram of a conventional write enable signal generating circuit.
Figure 3:
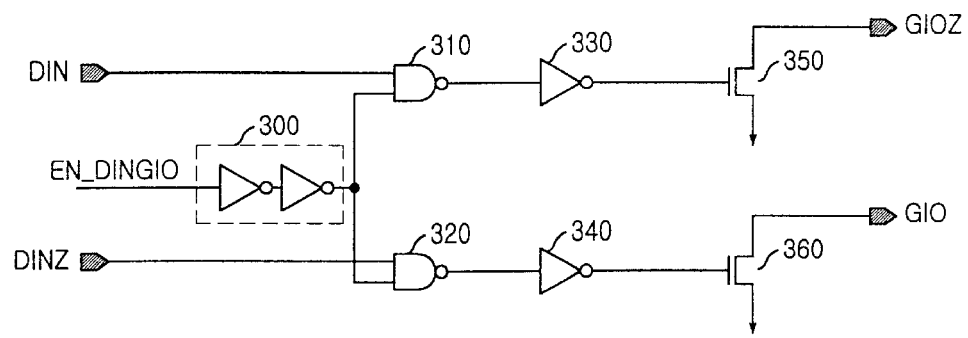
FIG. 3 is a circuit diagram of a conventional write driver.
Figure 4:
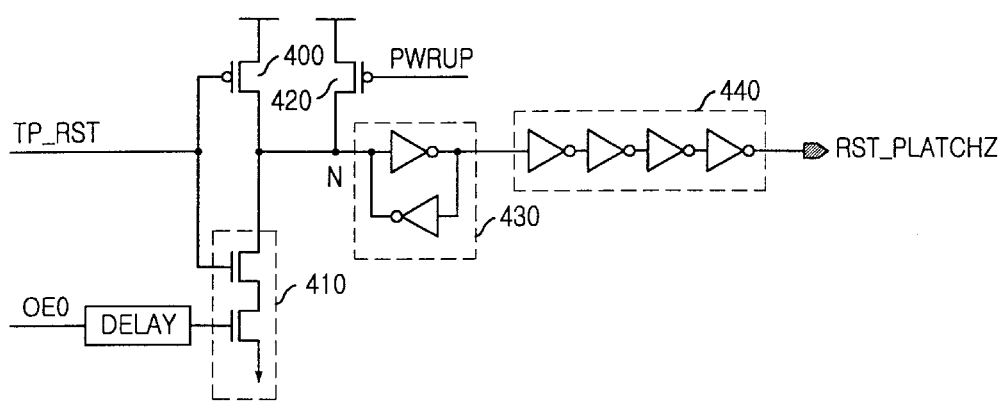
FIG. 4 is a circuit diagram of a conventional reset pipeline latch.
Figure 5:
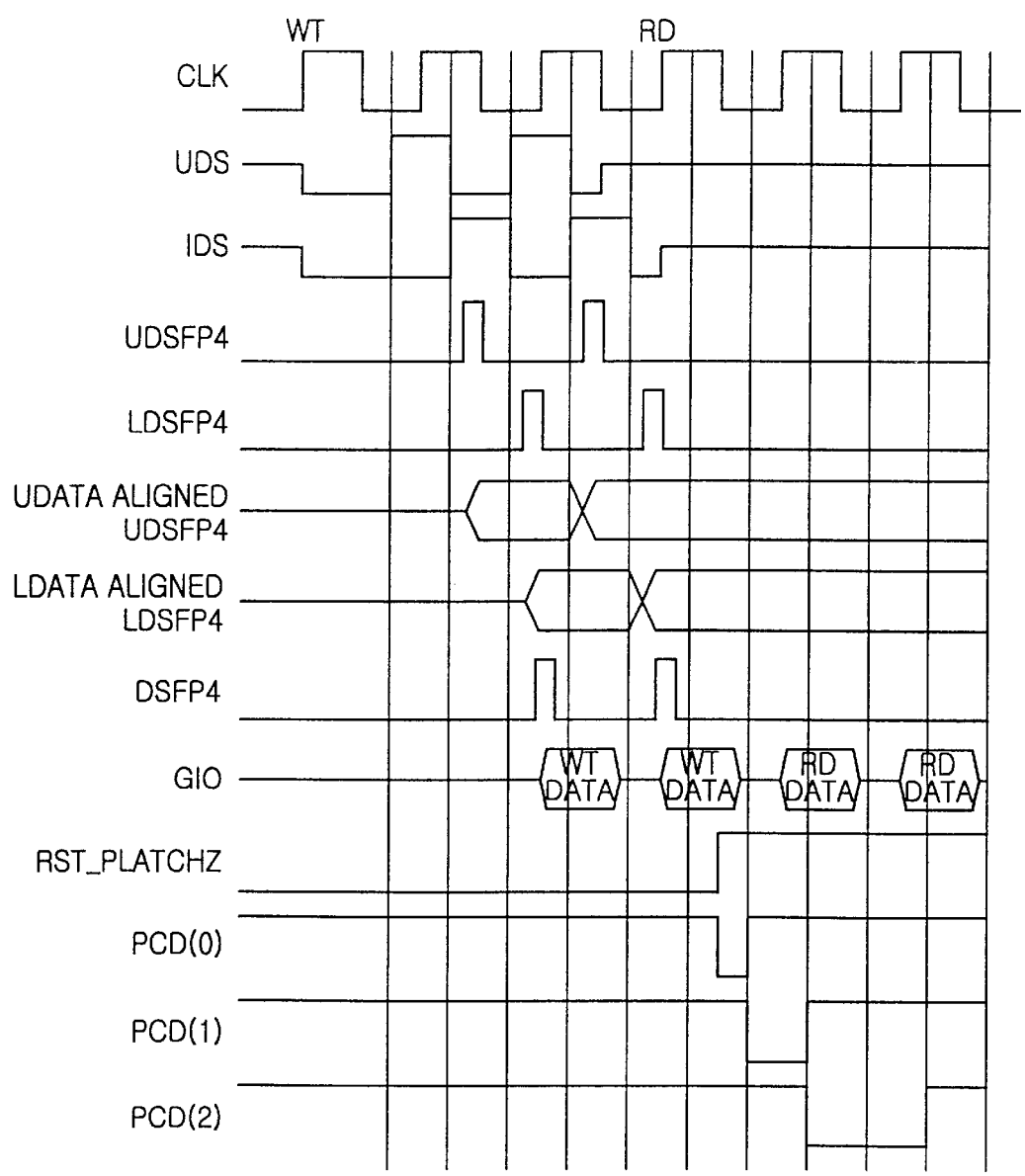
FIG. 5 is a timing diagram for explaining a conventional problem.
Figure 6:
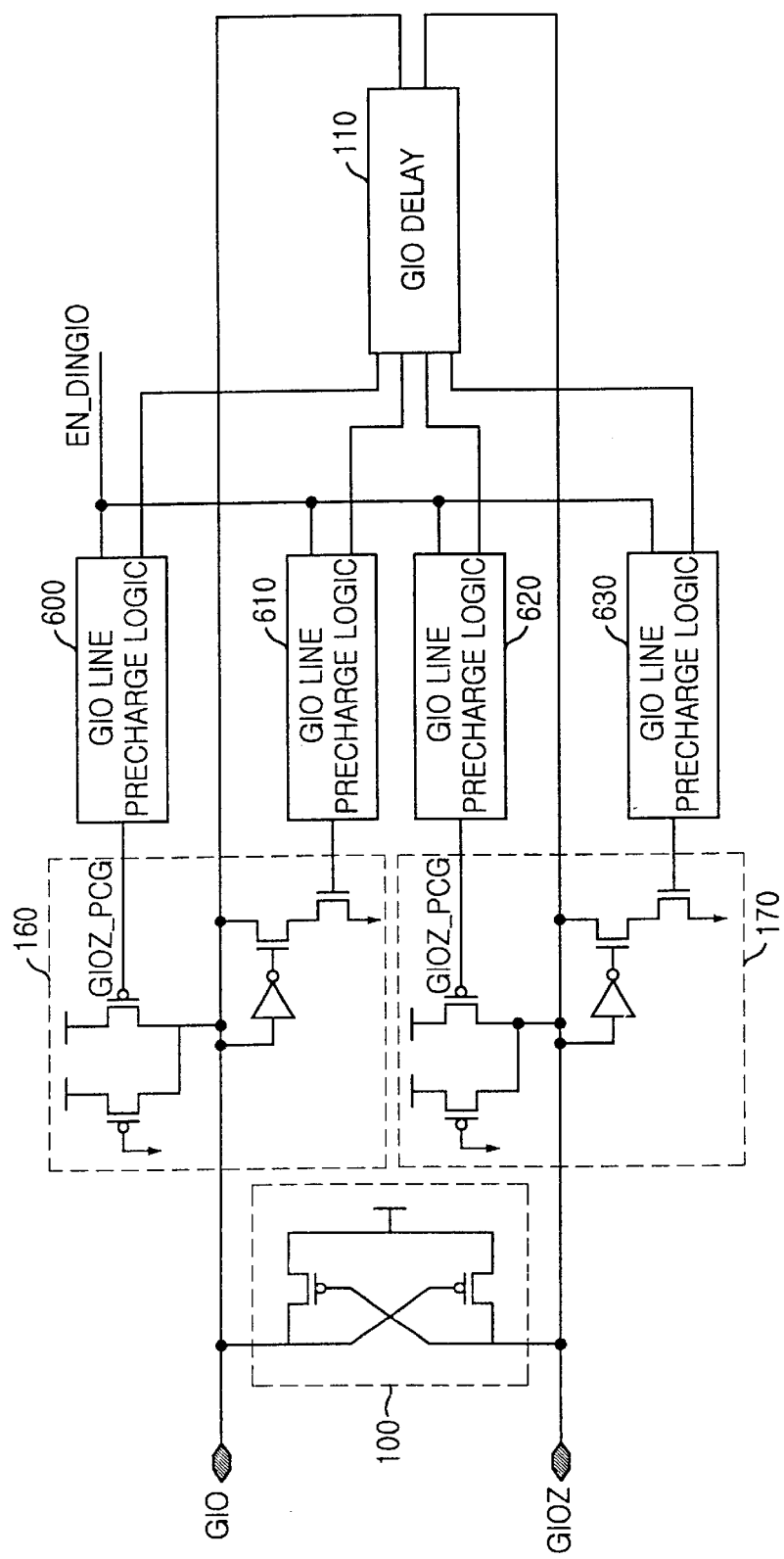
FIG. 6 is a circuit diagram of a global input/output line precharge circuit of the present invention.

FIG. 6 is a circuit diagram of a global input/output line precharge circuit of the present invention.

Referring to FIG. 6, the global input/output line precharge circuit comprises: a latch 100 for latching data on cross-coupled global input/output lines GIO and GIOZ; a global input/output line delay 110 for feed-backing the data on the global input/output lines GIO and GIOZ after delaying them by a predetermined time delay; global input/output line precharge logics 600, 610, 620 and 630 for precharging and discharging the global input/output lines GIO and GIOZ on which the data are feed-backed from the global input/output line delay 110; a first precharge and discharge logic 160 for applying a power voltage to the global input/output line GIO when high data is feed-backed on the output of the global input/output line precharge logic 600 and applying a ground voltage to the global input/output line GIO when low data is feed-backed on the output of the global input/output line precharge logic 610; and a second precharge and discharge logic 170 for applying the power voltage to the global input/output line GIOZ when high data is feed-backed on the output of the global input/output line precharge logic 620 and applying a ground voltage to the global input/output line GIOZ when low data is feed-backed on the output of the global input/output line precharge logic 630.

The first precharge and discharge logic 160 includes a PMOS transistor having a gate coupled to the ground voltage and a source-drain formed between the power voltage and the global input/output line GIO; a PMOS transistor having a gate coupled to the output of the global input/output precharge logic 600 and a source-drain formed between the power voltage and the global input/output line GIO; and NMOS transistors, each coupled to an inverted global input/output line signal and the output of the global input/output line precharge logic 610, serially coupled between the global input/output line GIO and the ground voltage.

Likewise, the second precharge logic 170 includes a PMOS transistor having a gate coupled to the ground voltage and a source-drain formed between the power voltage and the global input/output line GIOZ; a PMOS transistor having a gate coupled to the output of the global input/output precharge logic 620 and a source-drain formed between the power voltage and the global input/output line GIOZ; and NMOS transistors, each coupled to an inverted global input/output line signal and the output of the global input/output line precharge logic 630, serially coupled between the counter-global input/output line GIOZ and the ground voltage.

Figure 7:
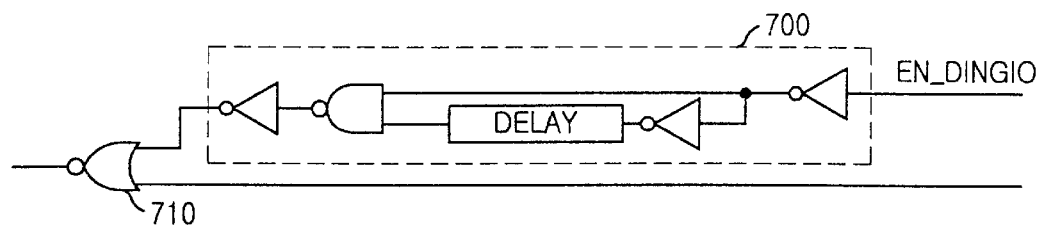
FIG. 7 is a circuit diagram of a global input/output line precharge logic of the present invention.

FIG. 7 is a circuit diagram of the global input/output precharge logics 600, 610, 620 and 630.

Referring to FIG. 7, each of the global input/output precharge logics 600, 610, 620 and 630 includes a pulse generating logic 700 receiving the write enable signal EN_DINGIO to generate a pulse when the write enable signal EN_DINGIO falls and a NOR gate for NOR-operating the output of the pulse generating logic 700 with the output of the global input/output line delay 110.

Figure 8:
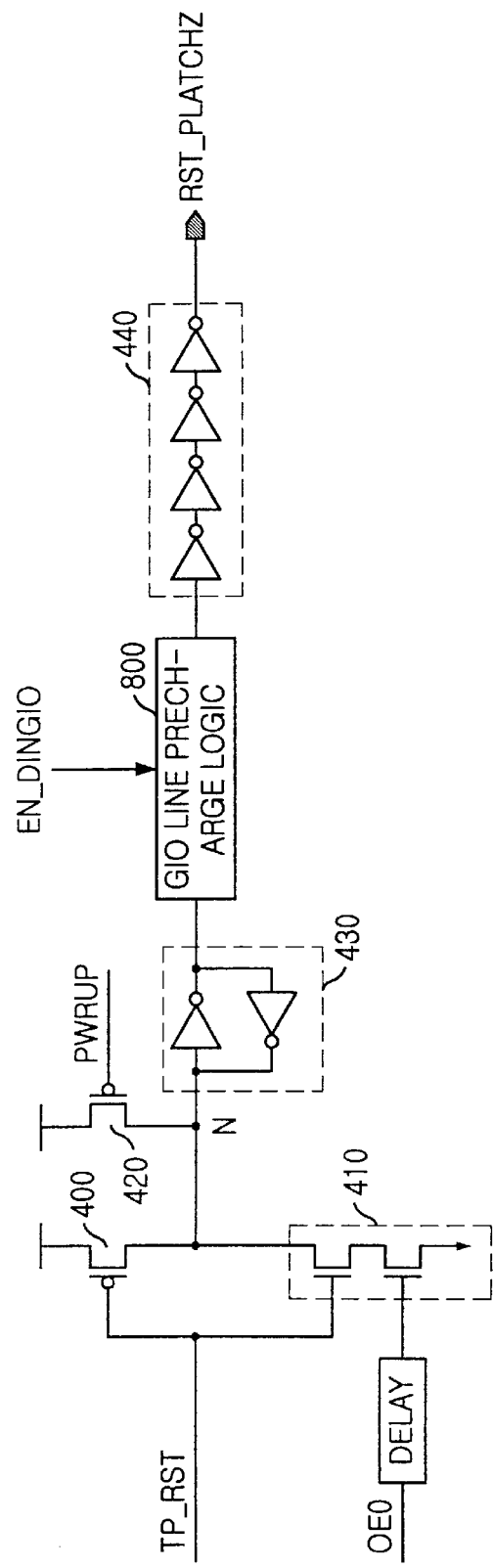
FIG. 8 is a circuit diagram of a reset pipeline latch of the present invention.

FIG. 8 is a circuit diagram of a reset pipeline latch of the present invention. This circuit activates a pipe signal (PCD) notifying the pipeline latch circuit that data is on the global input/output line GIO in order to load data loaded on the global input/output line GIO during read operation to the pipeline latch circuit for burst length operation.

Referring to FIG. 8, the reset pipeline latch of the present invention a PMOS transistor 400 having a gate coupled to a reset signal TP_RST activated to logic high when the read operation is performed and a source-drain formed between the power voltage and a node N; NMOS transistors 410 serially coupled between the node N and the ground voltage, one having a gate coupled to the reset signal and another having a gate coupled to a delayed version of an output enable signal OE0 activated during the read operation, a PMOS transistor 420 having a gate coupled to a power-up signal PWRUP and a source-drain formed between the power voltage and the node N, a latch 430 for latching the node N, a global input/output line precharge logic 800 for receiving the output of the latch to prevent data from loading from a pipeline if the write enable signal EN_DINGIO is logic high, and serially coupled inverters 440 for delaying the output of the global input/output line precharge logic 800 to output a reset pipeline latch signal RST_PLATCHZ.

As described above, the precharge logic of the present invention precharges a pair of the global input/output lines GIO and GIOZ, on which the write data exist, at early stage of the read operation and makes the reset pipeline latch signal RST_PLATCHZ, that activates the pipe signal (PCD), logic low so that the write data is prevented from transferred to the pipeline latch circuit. Therefore, the present invention can performs a normal read operation.

While the present invention has been shown and described with respect to the particular embodiments, it will be apparent to those skilled in the art that many changes and modifications may be made without departing from the spirit and scope of the invention as defined in the appended claims.

What is claimed is:

1. A global input/output precharge apparatus for use in semiconductor memory, comprising;

a latch configured to latch data on a global input/output line and a complementary global input/output line;

a global input/output line delay configured to delay the data on the global input/output line and the complementary global input/output line by a predetermined time delay;

a plurality of global input/output line precharge logics for pre-charging the global input/output line in response to a feedback signal from the global input/output line delay;

a first precharge logic for applying a power voltage to the global input/output line when a first logic state is fed back on the output of the global input/output line precharge logics and applying a ground voltage to the global input/output line when a second logic state is fed back on the output of the global input/output line precharge logics; and a second precharge logic for applying the power voltage to the complementary global input/output line when the first logic state is fed back on the output of the global input/output line precharge logics and applying the ground voltage to the complementary global input/output line when the second logic state is fed back on the output of the global input/output line precharge logics, wherein one of the global input/output precharge logics includes a pulse generating logic coupled to receive a write enable signal to generate a pulse when the write enable signal falls; and a NOR gate coupled to receive the output of the pulse generating logic and the output of the global input/output line delay.

2. The global input/output precharge apparatus as recited in claim 1, wherein the first precharge logic includes:

a PMOS transistor having a gate coupled to the ground voltage and a source-drain formed between the power voltage and the global input/output line;

a PMOS transistor having a gate coupled to the output of the global input/output precharge logics and a source-drain formed between the power voltage and the global input/output line; and NMOS transistors, each coupled to the inverted global input/output line and the output of the global input/output line precharge logic, serially coupled between the global input/output line and the ground voltage.

3. The global input/output precharge apparatus as recited in claim 1, wherein the write enable signal is de-asserted to logic low when a read command is activated, and asserted to logic high when a write command is activated.

* * * * *